US012574027B2

(12) United States Patent
Zolj et al.

(10) Patent No.: US 12,574,027 B2
(45) Date of Patent: Mar. 10, 2026

(54) PIECEWISE CONDUCTANCE NETWORK FOR RF SWITCH ON-STATE LINEARIZATION

(71) Applicant: Qorvo US, Inc., Greensboro, NC (US)

(72) Inventors: Adnan Zolj, Nashville, TN (US); Jinsung Choi, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 79 days.

(21) Appl. No.: 18/385,029

(22) Filed: Oct. 30, 2023

(65) Prior Publication Data

US 2024/0154578 A1     May 9, 2024

Related U.S. Application Data

(60) Provisional application No. 63/382,755, filed on Nov. 8, 2022.

(51) Int. Cl.
H03K 17/16          (2006.01)
(52) U.S. Cl.
CPC ..... *H03K 17/162* (2013.01); *H03F 2200/451* (2013.01)
(58) Field of Classification Search
None
See application file for complete search history.

(56) References Cited

U.S. PATENT DOCUMENTS

| | | | | |
|---|---|---|---|---|
| 5,751,142 A | * | 5/1998 | Dosho ..................... | G05F 3/247 |
| | | | | 323/901 |
| 6,107,877 A | * | 8/2000 | Miguelez ............. | H03F 1/3276 |
| | | | | 330/149 |

| | | | | |
|---|---|---|---|---|
| 6,580,319 B1 | * | 6/2003 | Cummings ........... | H03F 1/3282 |
| | | | | 330/144 |
| 7,436,237 B2 | * | 10/2008 | Hikita ................ | H03K 17/6871 |
| | | | | 327/383 |
| 8,405,455 B2 | * | 3/2013 | Coupland ............. | H03F 1/3211 |
| | | | | 330/110 |
| 8,975,947 B1 | * | 3/2015 | Seshita ................ | H03K 17/162 |
| | | | | 327/384 |
| 9,236,957 B2 | | 1/2016 | Bolton et al. | |
| 10,491,209 B2 | * | 11/2019 | Dicicco .................. | H03K 17/16 |
| 10,734,987 B2 | * | 8/2020 | Solomko ................. | H04B 1/48 |
| 10,749,518 B2 | * | 8/2020 | Maxim ................ | H10D 86/201 |
| 11,196,159 B2 | * | 12/2021 | Liu ...................... | H03K 17/693 |
| 2011/0018646 A1 | * | 1/2011 | Lee ...................... | H03B 5/1221 |
| | | | | 331/117 FE |
| 2018/0145678 A1 | * | 5/2018 | Maxim ................ | H03K 17/102 |

\* cited by examiner

*Primary Examiner* — Thomas J. Hiltunen

(74) *Attorney, Agent, or Firm* — Withrow & Terranova, P.L.L.C.

(57) ABSTRACT

A conductance network is disclosed for switching circuitry. In some embodiments, the conductance network includes a first conductance stage and a second conductance stage. The first conductance stage is configured to define a first voltage-to-current response such that the first voltage-to-current response defines a first deadband region between a first pair of quasi-quadratic or quasi-linear regions. The second conductance stage is configured to define a second voltage-to-current response such that the second voltage-to-current response defines a second deadband region between a second pair of quasi-quadratic or quasi-linear regions, wherein the second deadband region is wider than the first deadband region.

16 Claims, 16 Drawing Sheets

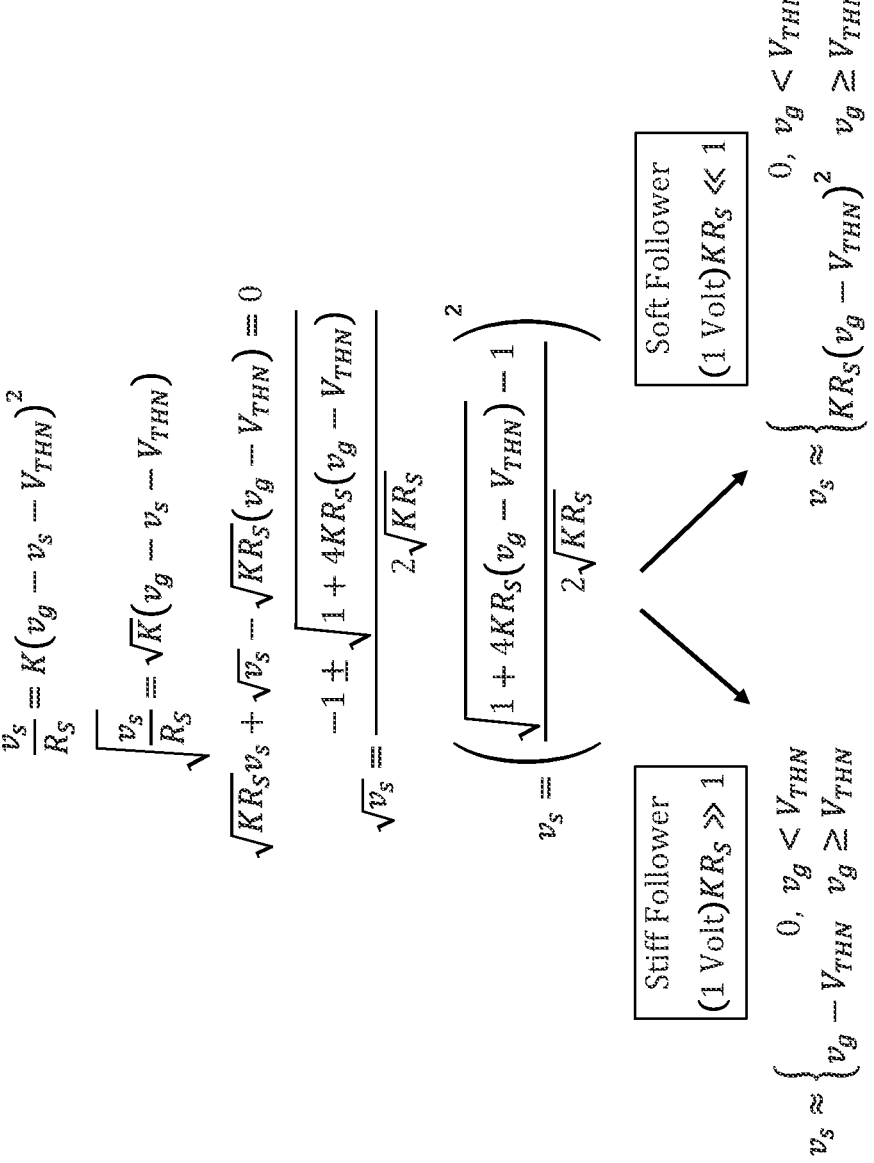

$$\frac{v_s}{R_S} = K(v_g - v_s - V_{THN})^2$$

$$\sqrt{\frac{v_s}{R_S}} = \sqrt{K}(v_g - v_s - V_{THN})$$

$$\sqrt{KR_S}v_s + \sqrt{v_s} - \sqrt{KR_S}(v_g - V_{THN}) = 0$$

$$\sqrt{v_s} = \frac{-1 \pm \sqrt{1 + 4KR_S(v_g - V_{THN})}}{2\sqrt{KR_S}}$$

$$v_s = \left(\frac{\sqrt{1 + 4KR_S(v_g - V_{THN})} - 1}{2\sqrt{KR_S}}\right)^2$$

Stiff Follower
$(1\ \text{Volt})KR_S \gg 1$ $$v_s \approx \begin{cases} 0, & v_g < V_{THN} \\ v_g - V_{THN} & v_g \geq V_{THN} \end{cases}$$

Soft Follower
$(1\ \text{Volt})KR_S \ll 1$ $$v_s \approx \begin{cases} 0, & v_g < V_{THN} \\ KR_S(v_g - V_{THN})^2 & v_g \geq V_{THN} \end{cases}$$

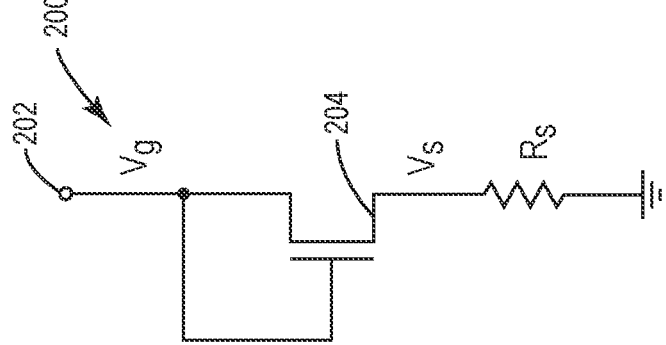

*FIG. 2*

1600

CLOSING A MAIN SWITCH CONNECTED BETWEEN
A PAIR OF RF TERMINALS
1602

CLOSING AT LEAST ONE SWITCH IN A CIRCUIT BRANCH
WITH A CONDUCTANCE NETWORK, WHEREIN THE
CONDUCTANCE NETWORK COMPRISES CONDUCTANCE
STAGES AND WHEREIN EACH SEGMENTAL CONDUCTANCE STAGE
IS CONFIGURED TO HAVE A VOLTAGE-TO-CURRENT RESPONSE
THAT DEFINES A DEADBAND REGION BETWEEN A PAIR
OF QUASI-QUADRATIC OR QUASI-LINEAR REGIONS
SUCH THAT THE CONDUCTANCE STAGES DEFINE A SEQUENCE
OF DEADBAND REGIONS WITH WIDTHS THAT ARE SEQUENTIALLY
INCREMENTED IN ACCORDANCE WITH VOLTAGE STEP
1604

*FIG. 16*

PIECEWISE CONDUCTANCE NETWORK FOR RF SWITCH ON-STATE LINEARIZATION

RELATED APPLICATIONS

This application claims the benefit of provisional patent application Ser. No. 63/382,755, filed Nov. 8, 2022, the disclosure of which is hereby incorporated herein by reference in its entirety.

FIELD OF THE DISCLOSURE

This disclosure relates generally to radio frequency circuitry that corrects third-order intermodulation distortion that results from the closing of a switch.

BACKGROUND

Radio frequency (RF) switch devices are often used to route RF signals to different circuit components of an RF circuit. These RF signals are composite RF signals that carry different RF signals within different RF frequency bands. The closing of the switch device can increase third-order resonant vibrations that are introduced into the RF signal due to the closing of the switch device. When RF signals are carried in RF frequency bands that are close to one another, it becomes difficult to filter out the intermodulation third-order resonant vibrations resulting from the closing of the switch device. This is because the third-order intermodulation distortion is produced very near the RF frequency bands of the RF signals.

SUMMARY

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Switching circuitry, includes: a first RF terminal; a second RF terminal; a first circuit branch connected between the first RF terminal and the second RF terminal, the first circuit branch includes a main switch, wherein the main switch generates third order intermodulation, IMD3, resonant vibrations in response to the main switch being closed; and a second circuit branch connected between the first RF terminal and the second RF terminal, the second circuit branch includes a conductance network wherein the conductance network has an impedance with a frequency response with a same magnitude as the IMD3 resonant vibrations but with an opposite phase. In some embodiments, the second circuit branch is connected in parallel with respect to the first circuit branch. In some embodiments, the switching circuitry further includes: a first switch device connected between the first RF terminal and an RF input terminal of the conductance network; and a second switch device connected between an RF output terminal of the conductance network and the second RF terminal. In some embodiments, the switching circuitry further includes: a third switch device connected between the RF input terminal of the conductance network and the RF output terminal of the conductance network. In some embodiments, the switching circuitry further includes: a capacitive device that is connected in parallel with the conductance network. In some embodiments, the capacitive device is configured to provide a variable capacitance. In some embodiments, the conductance network includes: a first diode connected segment connected between an RF input terminal of the conductance network and an RF output terminal of the conductance network; a second diode connected segment connected between the RF input terminal of the conductance network and the RF output terminal of the conductance network; and wherein the first diode connected segment and the second diode connected segment are connected so as to have opposite polarities. In some embodiments, the first diode connected segment includes a first diode connected N channel field effect transistor (NFET); the second diode connected segment includes a second diode connected NFET; and wherein the first diode connected NFET and the second diode connected NFET are connected between the RF input terminal of the conductance network and the RF output terminal of the conductance network so as to have opposite polarities. In some embodiments, the first diode connected segment further includes a first capacitor, a first resistor, and a second resistor, wherein: the first capacitor is connected between a gate of the first diode connected NFET and the RF input terminal of the conductance network; the first resistor is connected between a first bias terminal and the gate of the first diode connected NFET; and the second resistor is connected between a first drain/source terminal of the first diode connected NFET and the RF output terminal; and the second diode connected segment further includes a second capacitor, a third resistor, and a fourth resistor, wherein: the second capacitor is connected between a gate of the second diode connected NFET and the RF output terminal of the conductance network; the third resistor is connected between a second bias terminal and the gate of the second diode connected NFET; and the fourth resistor is connected between a second drain/source terminal of the second diode connected NFET and the RF input terminal. In some embodiments, the first bias terminal is configured to receive a first negative bias voltage; and the second bias terminal is configured to receive a second negative bias voltage. In some embodiments, the first diode connected segment further includes a first capacitor and a first resistor, wherein: the first capacitor is connected between a gate of the first diode connected NFET and the RF input terminal of the conductance network; and the first resistor is connected between a first bias terminal and the gate of the first diode connected NFET; and the second diode connected segment further includes a second capacitor and a second resistor, wherein: the second capacitor is connected between a gate of the second diode connected NFET and the RF output terminal of the conductance network; and the second resistor is connected between a second bias terminal and the gate of the second diode connected NFET. In some embodiments, the first bias terminal is configured to receive a first negative bias voltage; and the second bias terminal is configured to receive a second negative bias voltage. In some embodiments, a first diode connected segment includes a first diode connected P channel field effect transistor, PFET; a second diode connected segment includes a second diode connected PFET; wherein the first diode connected PFET and the second diode connected PFET are connected between an RF input terminal of the conductance network and an RF output terminal of the conductance network so as to have opposite polarities. In some embodiments, the first diode connected segment further includes a first capacitor, a first resistor, and a second resistor, wherein: the first capacitor is connected between a gate of the first diode connected PFET and the RF input terminal of the conductance network; the first resistor is connected between a first bias terminal and the gate of the first diode connected PFET; and the second resistor is connected between a first drain/source terminal of the first diode connected PFET and the RF output terminal; and the second diode connected segment further includes a second capacitor, a third resistor, and a fourth resistor, wherein: the second capacitor is connected between a gate of the second diode connected PFET and the RF output terminal of the conductance network; the third resistor is connected between a second bias terminal and the gate of the second diode connected PFET; and the fourth resistor is connected between a second drain/source terminal of the second diode connected PFET and the RF input terminal. In some embodiments, the first bias terminal is configured to receive a first positive bias voltage; and the second bias terminal is configured to receive a second positive bias voltage. In some embodiments, the first diode connected segment further includes a first capacitor and a first resistor, wherein: the first capacitor is connected between a gate of the first diode connected PFET and the RF input terminal of the conductance network; and the first resistor is connected between a first bias terminal and the gate of the first diode connected PFET; and the second diode connected segment further includes a second capacitor and a second resistor, wherein: the second capacitor is connected between a gate of the second diode connected PFET and the RF output terminal of the conductance network; and the second resistor is connected between a second bias terminal and the gate of the second diode connected PFET. In some embodiments, the first bias terminal is configured to receive a first positive bias voltage; and the second bias terminal is configured to receive a second positive bias voltage. In some embodiments, the conductance network is configured to have a voltage to current response that defines a deadband region between a pair of quasi-quadratic or quasi-linear regions. In some embodiments, the conductance network includes a plurality of conductance stages coupled between an RF input terminal of the conductance network and an RF output terminal of the conductance network. In some embodiments, each of the plurality of conductance stages is configured to have a voltage to current response that defines a deadband region between a pair of quasi-quadratic or quasi-linear regions.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2 is a diode-connected segment along with equations that describe the operation of the diode-connected segment, in accordance with some embodiments.

4

Figure 6:
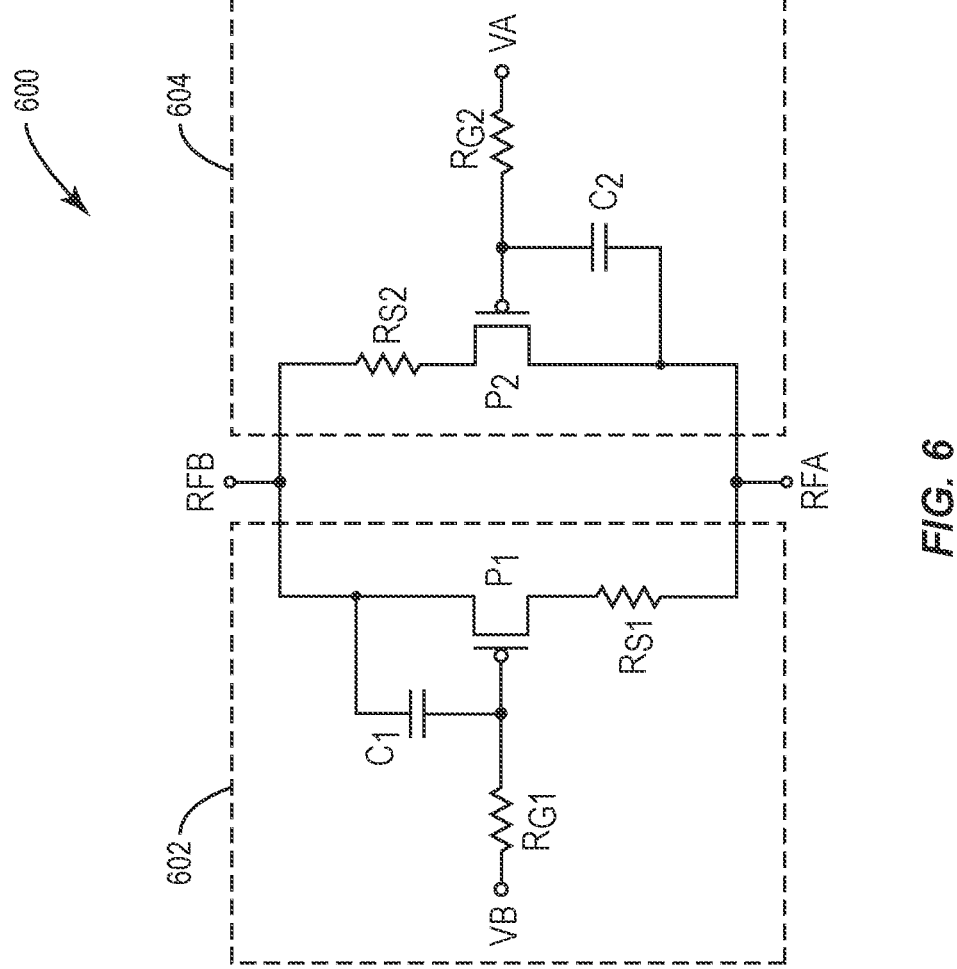

FIG. 6 illustrates another conductive cell, in accordance with some embodiments.

Figure 7:
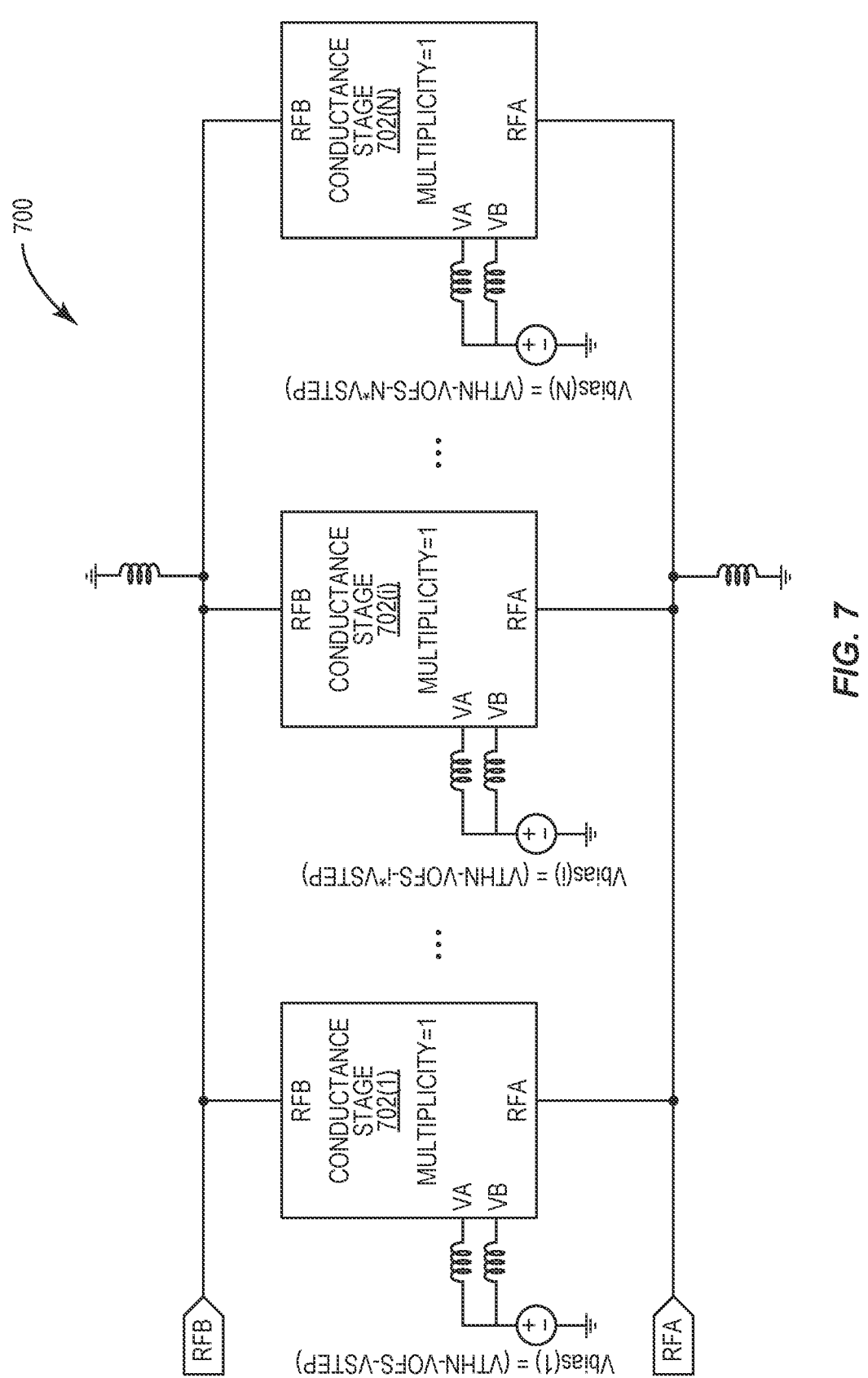

FIG. 7 is a diagram illustrating a conductance network, in accordance with some embodiments.

Figure 8:
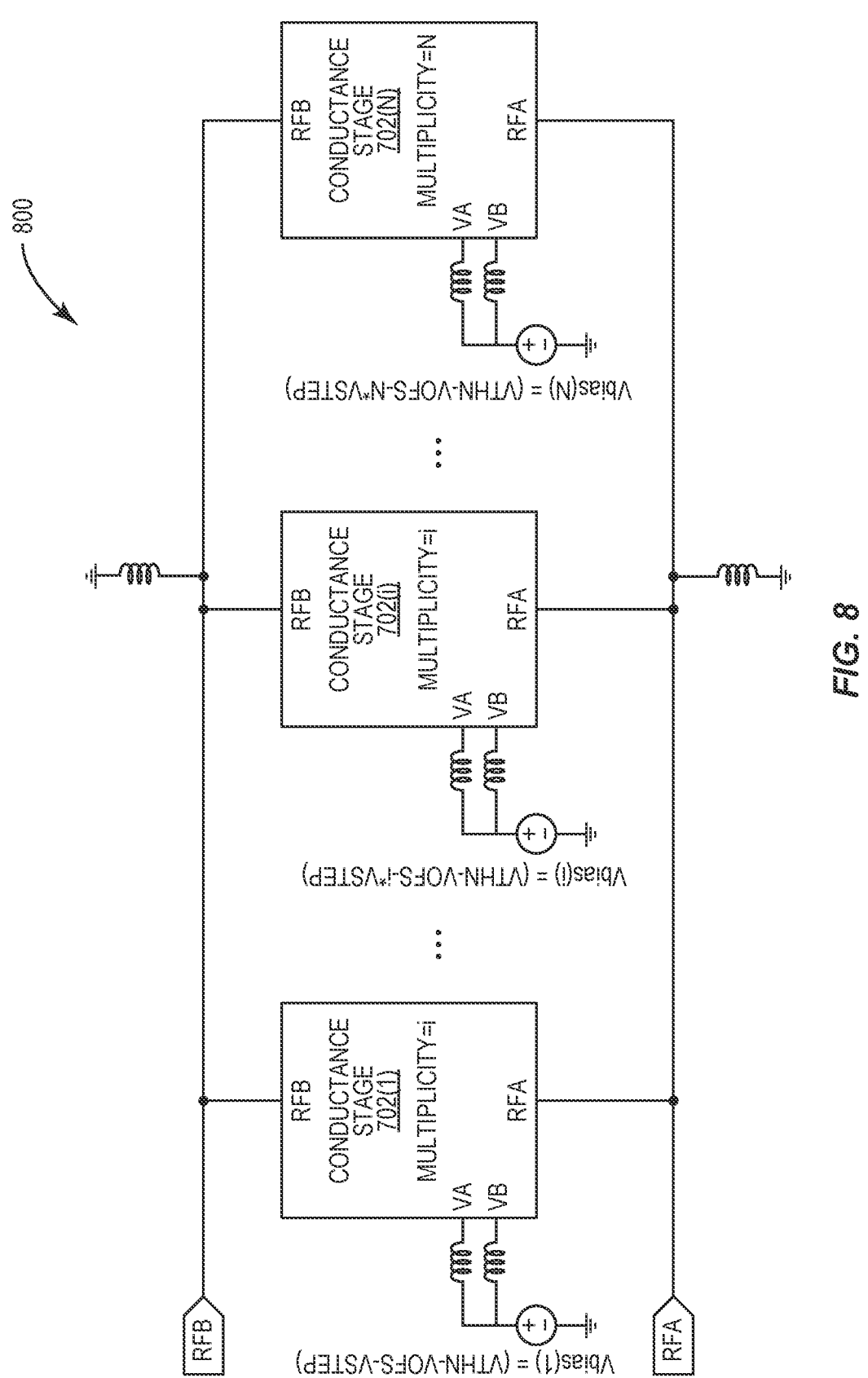

FIG. 8 is a diagram illustrating another conductance network, in accordance with some embodiments.

Figure 9:
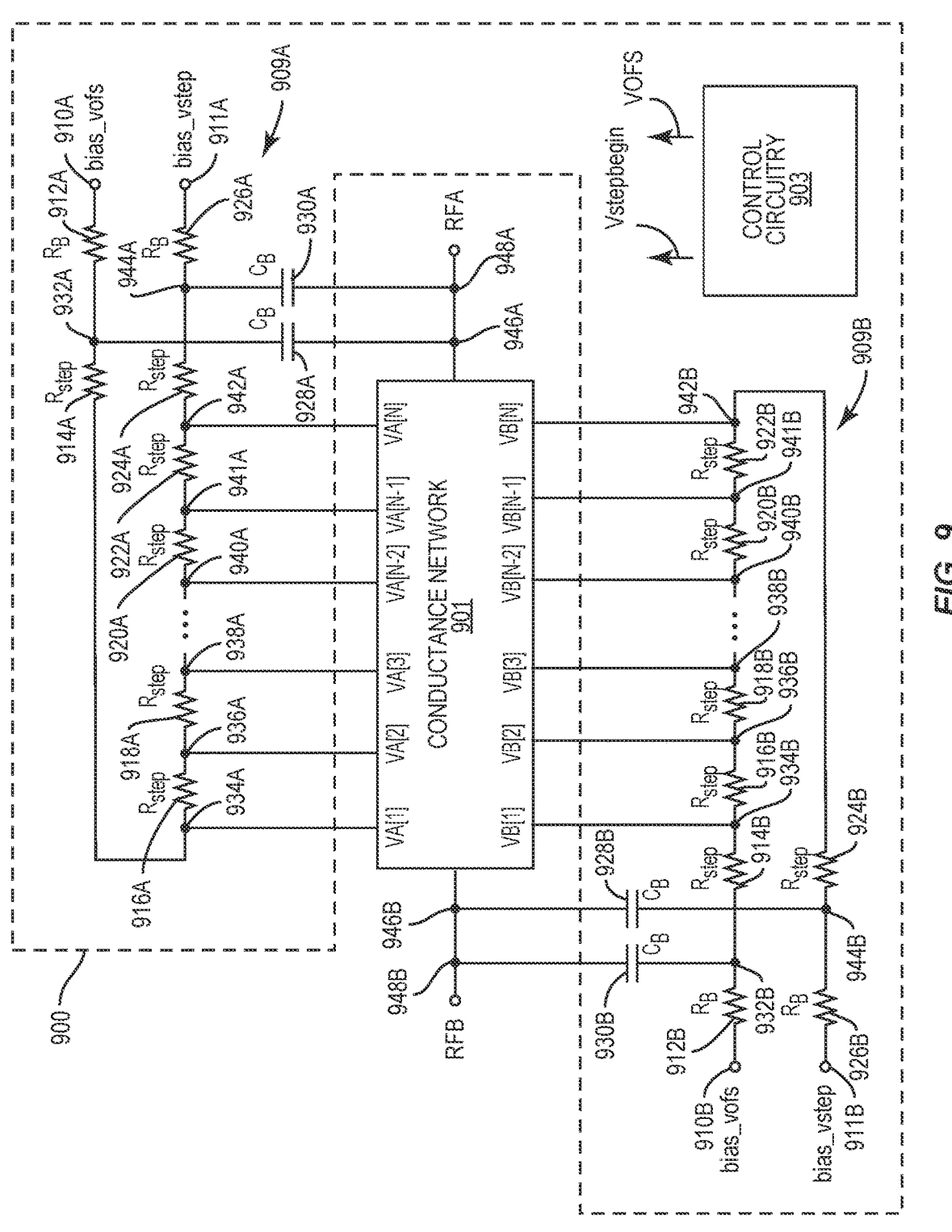

FIG. 9 illustrates a control network and a conductance network, in accordance with some embodiments.

Figure 1:
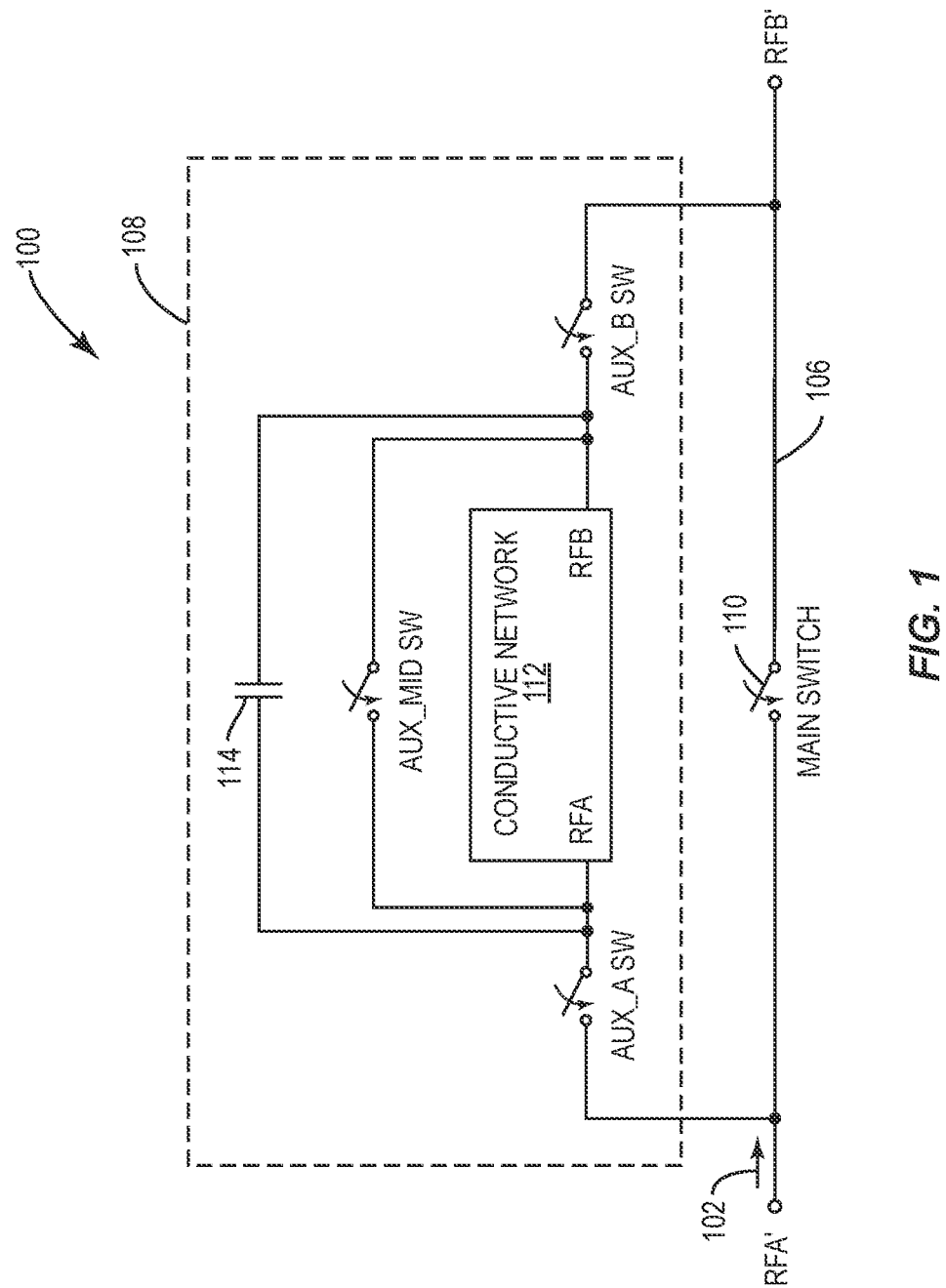
FIG. 1 is a block diagram of switching circuitry, in accordance with some embodiments.
Figure 10:
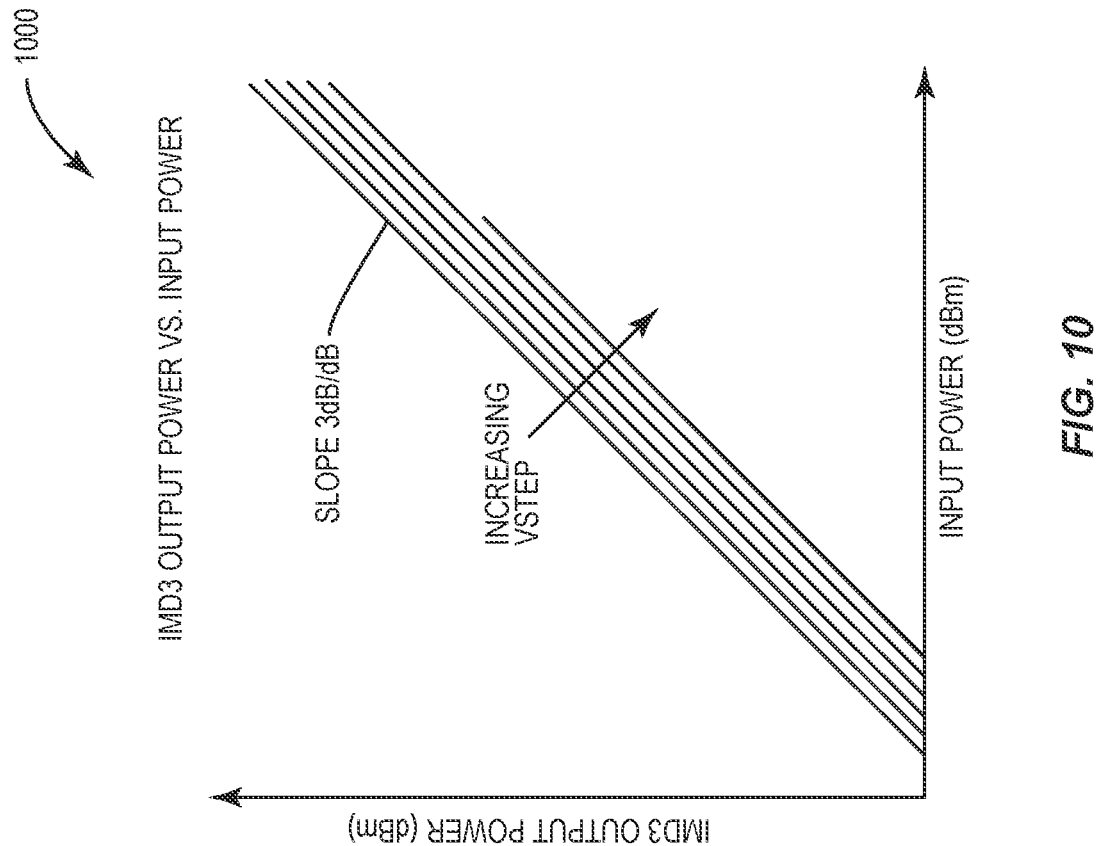

FIG. 10 is a power diagram illustrating the operation of the switching circuitry in FIG. 1 using the conductance network described above with respect to FIG. 7 or FIG. 8.

Figure 11:
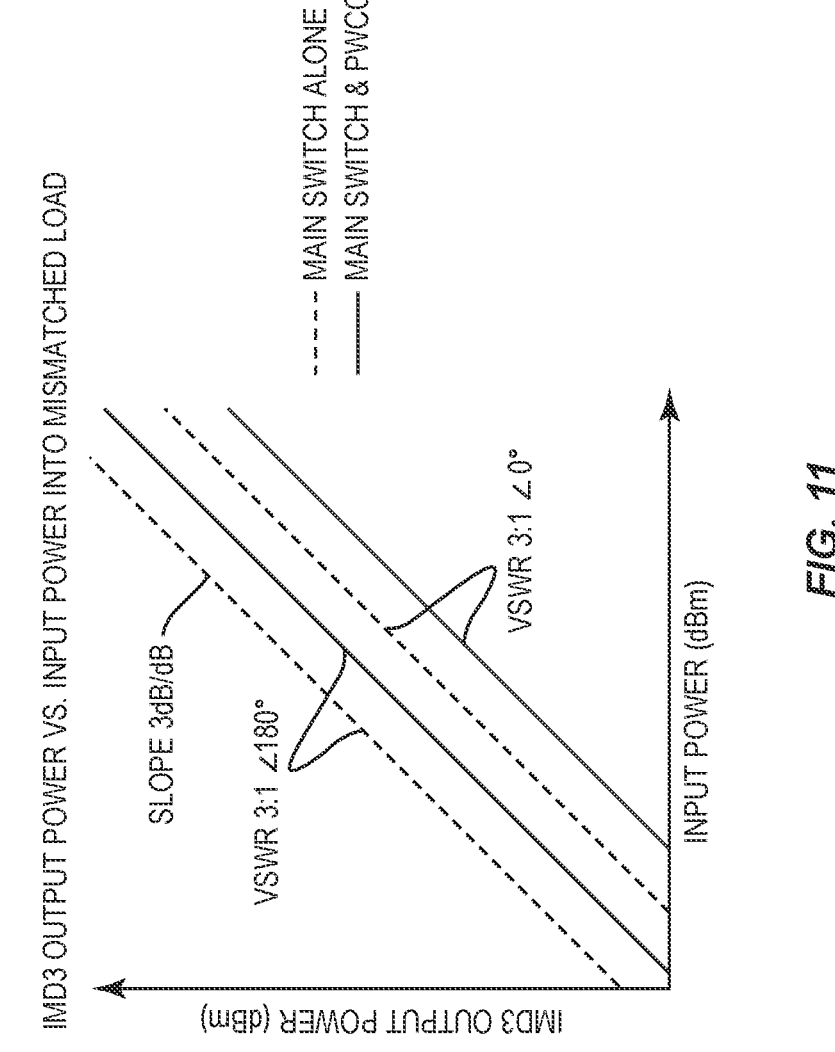

FIG. 11 is a power diagram illustrating the operation of the switching circuitry in FIG. 1 using the conductance network described above with respect to FIG. 8 operating into a mismatched load.

Figure 12:
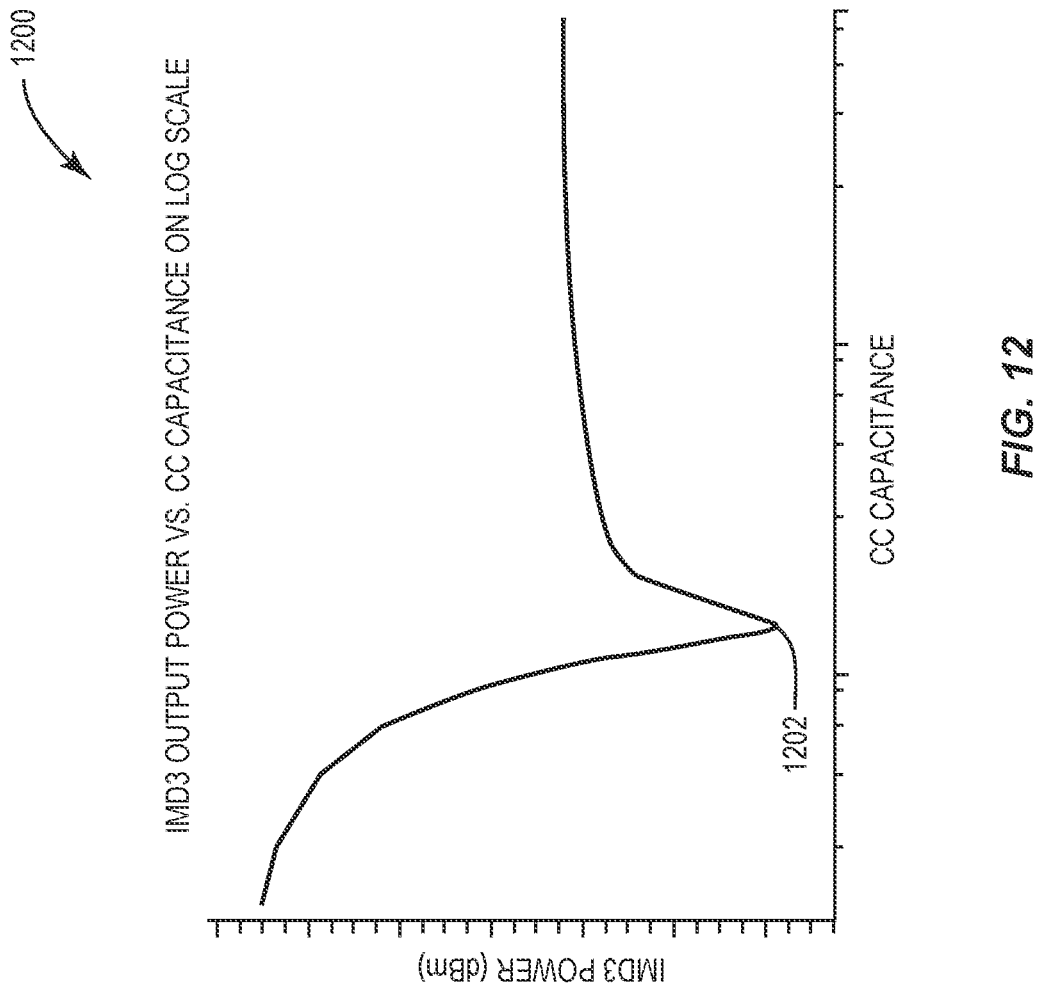

FIG. 12 is a plot of the capacitive value of the variable capacitance of the capacitive device as defined in FIG. 1 versus the third-order intermodulation distortion response.

Figure 13:
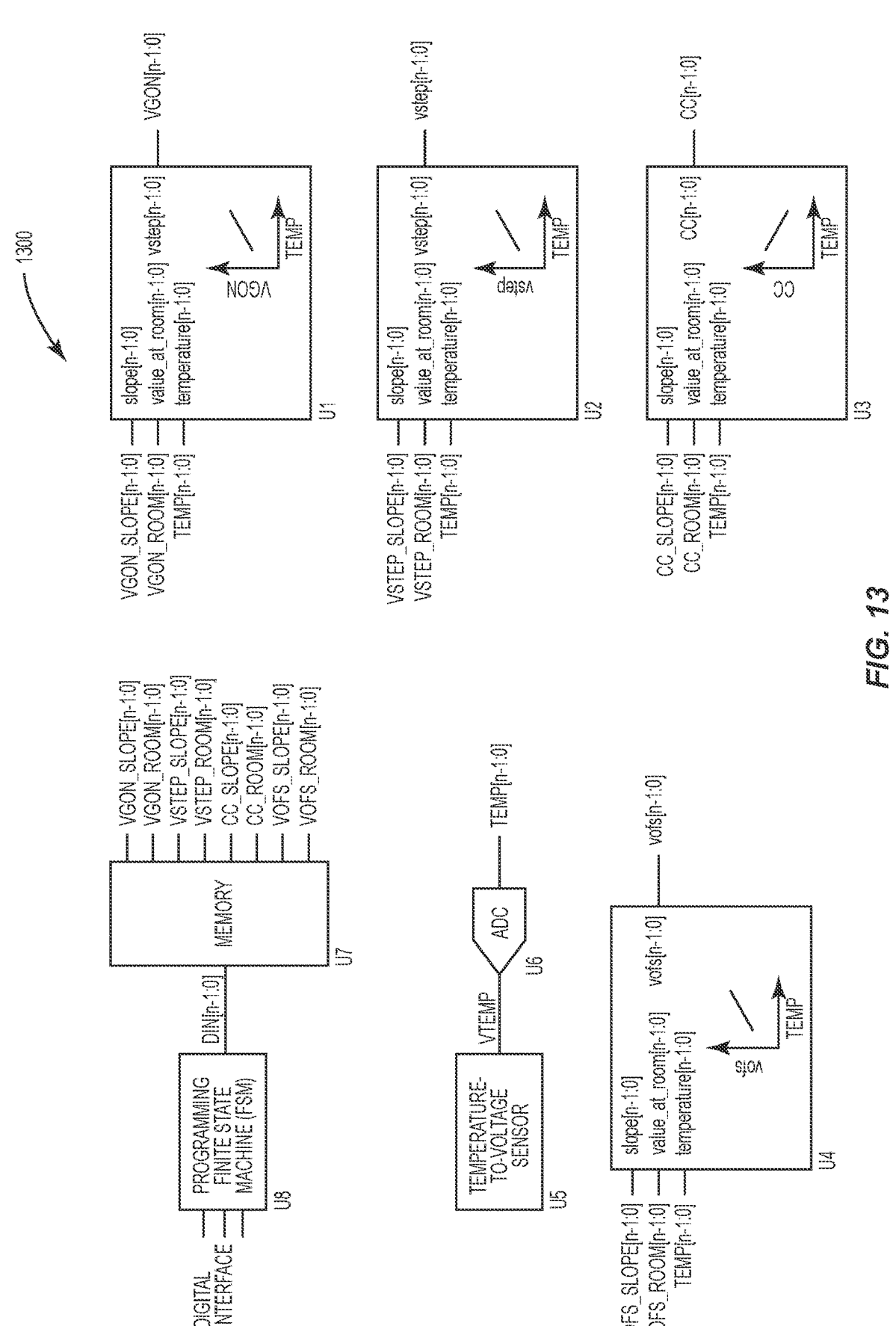

FIG. 13 is a temperature control circuit, in accordance with some embodiments.

Figure 14:
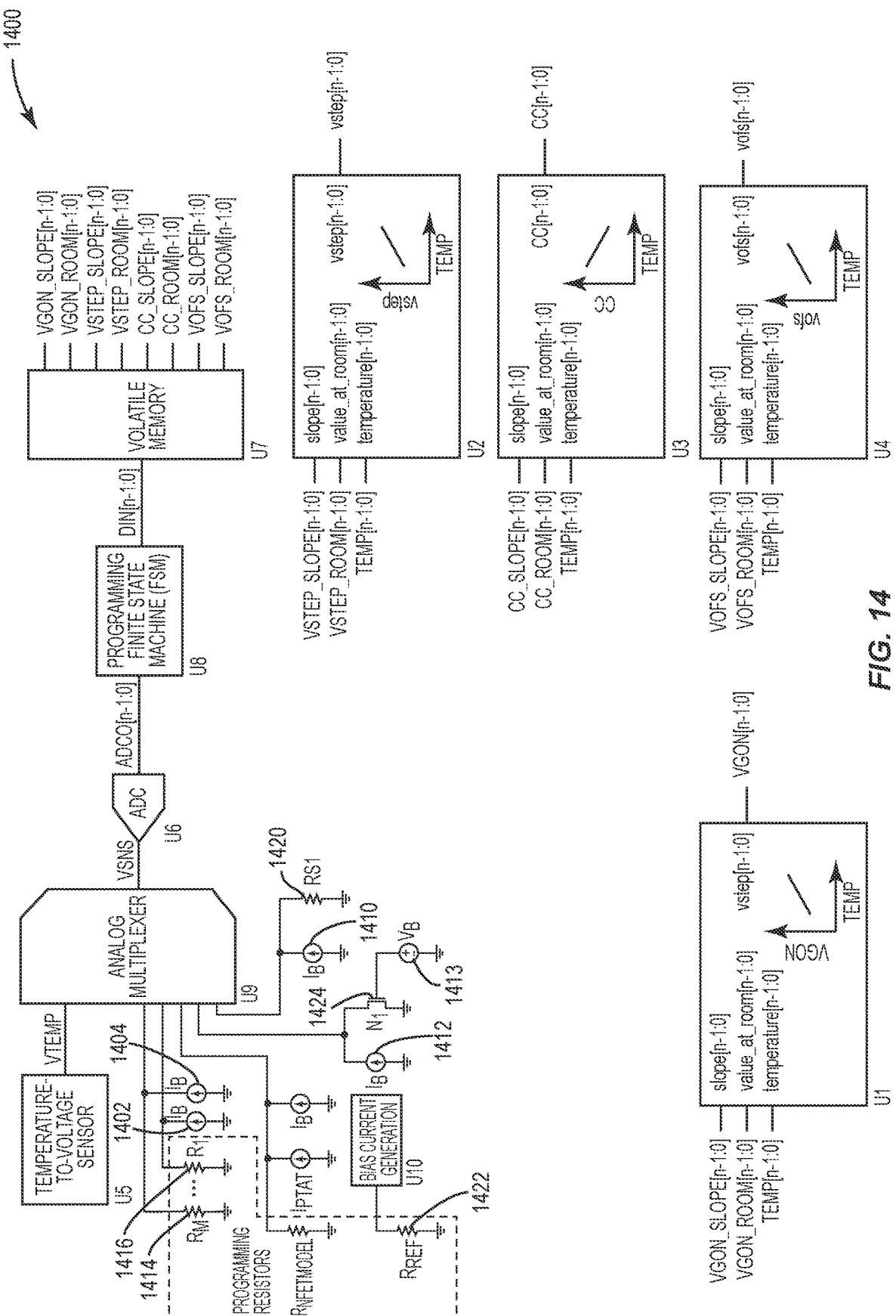

FIG. 14 is a temperature control circuit, in accordance with some embodiments.

Figure 15:
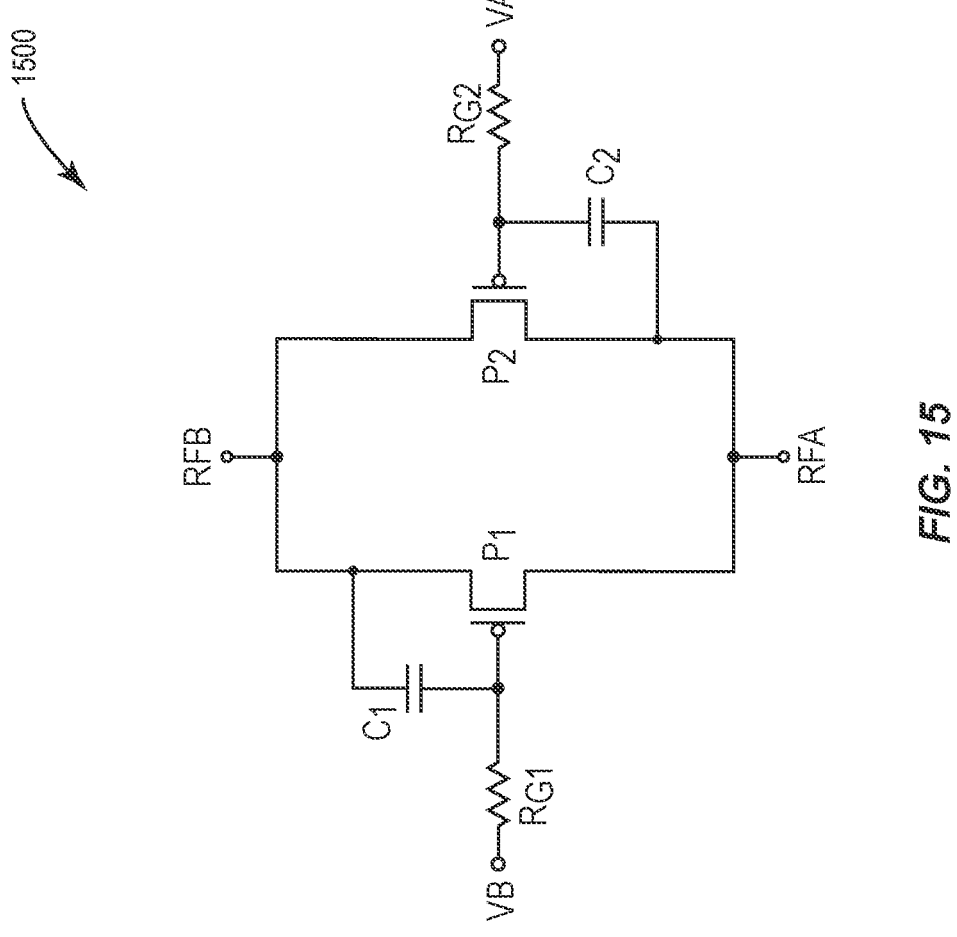

FIG. 15 illustrates a conductive cell, in accordance with some embodiments.

FIG. 16 is a flow diagram that relates to a method of cancelling (or neutralizing) IMD3 from an RF signal, in accordance with some embodiments.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

This disclosure relates generally to radio frequency (RF) circuitry that reduces or removes third-order intermodulation distortion that results from the closing of a switch device. In some embodiments, the RF frequency circuitry is connected in parallel to the switch device. The RF frequency circuitry includes a conductance network. The conductance network is configured to produce a third-order resonant response having a magnitude that is the same (or nearly the same) as the magnitude of the third-order intermodulation (IMD3) resonant vibrations generated by the closing of the switch device but with the opposite phase. The conductance network is thus configured to provide cancellation of the IMD3 resonant vibrations without requiring an RF filter.

In some embodiments, the conductance network includes a plurality of conductance stages. Each conductance stage is configured to define a voltage-to-current response to a deadband region between a between the pair of quasi-quadratic or quasi-linear regions. The cumulative combination of the voltage-to-current responses of the conductance stages is used to approximate the IMD3 intermodulation response resulting from the closing of the switch device but with an opposite phase.

FIG. 1 is a block diagram of switching circuitry 100, in accordance with some embodiments.

The switching circuitry 100 includes an RF terminal RFA' and an RF terminal RFB'. In FIG. 1, the RF terminal RFA' is utilized as an RF input terminal while the RF terminal RFB' is utilized as an RF output terminal. Thus, an RF signal 102 is received at the RF terminal RFA' and is output at the RF terminal RFB'. In other embodiments, the RF terminal RFA' is utilized as an RF output terminal while the RF terminal RFB' is utilized as an RF input terminal.

A first circuit branch 106 is connected between the RF terminal RFA' and the RF terminal RFB'. A second circuit branch 108 is also connected between the RF terminal RFA' and the RF terminal RFB'. Accordingly, the first circuit branch 106 and the second circuit branch 108 are connected in parallel. The first circuit branch 106 includes a switch device 110. The switch device 110 (also referred to as the main switch 110) is operable in an open state and in a closed state. The closed state is a low impedance state where signals are allowed to pass, and the open state is a high impedance state where signals are blocked. In the closed state, the switch device 110 passes the RF signal 102 from the RF terminal RFA' to the RF terminal RFB'. In the open state, the switch device 110 prevents the RF signal 102 from passing between the RF terminal RFA' to the RF terminal RFB'.

By opening and closing the switch device 110, the switch device 110 operates to determine whether or not the RF signal 102 is allowed to flow to downstream circuitry (not explicitly shown) that is connected to the RF terminal RFB'. However, the closing of the switch device 110 can increase third-order resonant vibrations that are introduced into the RF signal 102 if no corrective techniques are applied. This is particularly troublesome when the RF signal 102 is a composite RF signal within different RF signals being carried in separate but close RF bands. If no corrective techniques were applied, IMD3 resonant vibrations can be introduced as a result of the different RF signals carried in the different bands. To correct for IMD3 resonant vibrations, the second circuit branch 108 includes a conductance network 112. In some embodiments, the conductance network 112 creates a frequency response with the same or close to the same magnitude as the IMD3 resonant vibrations but with the opposite phase. In this manner, the IMD3 resonant vibrations are canceled or nearly cancelled from the RF signal 102, thereby reducing or eliminating third order IMD introduced as the result of the closing the switch device 110. In some embodiments, the conductance network 112 is configured to provide IMD3 cancellation along a power range that is wider than previously known techniques. Furthermore, in some embodiments, the conductance network 112 is configured to provide IMD3 cancellation in a manner that is less temperature sensitive than previously known techniques. In some embodiments, the voltage-to-current response of the conductance network 112 approximates a cubic function.

The conductance network 112 is connected between a switch device AUX_A SW and a switch device AUX_B SW. Another switch device AUX_MID SW is connected in parallel with the conductance network 112. The switch device AUX_A SW is connected between the RF terminal RFA' and an RF terminal RFA (i.e., the RF input terminal of the conductance network 112) of the conductance network 112. The switch device AUX_B SW is connected between an RF terminal RFB of the conductance network 112 (i.e., the RF output terminal of the conductance network 112) and the RF terminal RFB'. In some embodiments, the switch devices AUX_A SW, AUX_B SW are closed while the switch device 110 is closed.

The second circuit branch 108 also includes a capacitive device 114 that is connected in parallel with the conductance network 112. The capacitive device 114 is configured to provide a variable capacitance. In some embodiments, the capacitive device 114 is a digitally controlled network of capacitors, a varactor, and/or the like. The variable capacitance of the capacitive device 114 is set to compensate for the phase shift introduced by the parasitic inductance of the switch device 110. The time constant resulting from the combined resistance of the switch devices AUX_A SW, AUX_B SW along with the variable capacitance of the capacitive device 114 matches the time constant of the parasitic inductance and resistance of the switch device 110 when it is closed.

In some embodiments, the switch devices AUX_A SW, AUX_B SW are opened while the switch device 110 is opened. In some embodiments, the switch device AUX_MID SW is opened while the switch device 110 is closed. In some embodiments, the switch device AUX_MID SW is closed while the switch device 110 is opened. The switch device AUX_MID SW protects the conductance network 112 from excessive voltage stress when the switch device 110 is in transition from the closed state to the open state and from the open state to the closed state, in accordance with some embodiments. Each of the switch devices AUX_A SW, AUX_B SW is configured to have a maximum blocking voltage that is at least half of the maximum blocking voltage of the main switch 110. In some embodiments, the switch devices AUX_A SW, AUX_B SW, and AUX_MID SW are configured to be smaller than that of the main switch 110 so as not to significantly load the switch device 110 or alter the on-state insertion loss and off-state isolation performance of the switch device 110. The switch devices AUX_A SW, AUX_B SW introduce the impedance of the conductance network 112 while the switch device 110 is closed and isolate the conductance network 112 while the switch device 110 is open. In this manner, the loading effects of the conductance network 112 do not load the RF terminals RFA', RFB' while the switch device 110 is open.

FIG. 2 is a diode-connected segment 200 along with simplified equations that describe the operation of the diode-connected segment using the gradual channel approximation of a MOSFET assuming long channel length, in accordance with some embodiments.

In some embodiments, the diode-connected segment 200 and the operational characteristics of the diode-connected segment 200 are relevant to the construction of the conductance network 112, shown in FIG. 1.

The diode-connected segment 200 includes an RF terminal 202, a field-effect transistor (FET) 204, and a resistor $R_s$. It should be noted that in the equations included in FIG. 2, $R_s$ represents the resistance value of the resistor $R_s$. In FIG. 2, the FET 204 is an N-channel FET (NFET). In other embodiments, the FET 204 is a P-channel FET (PFET). A gate of the FET 204 is connected to a drain of the FET 204. Thus, the FET 204 is diode-connected and operates like a diode. The drain of the FET 204 is connected to the RF terminal 202. One side of the resistor $R_s$ is connected to a source of the FET 204 while another side of the resistor $R_s$ is connected to ground.

With regards to the equations shown in FIG. 2, $V_g$ represents the gate voltage, $V_s$ represents the source voltage, K is a constant for the FET 204, and $V_{THN}$ represents a threshold voltage of the FET 204. As shown in FIG. 2, the FET has two operational modes which are referred to as the stiff follower limit and the soft follower limit. The operational mode referred to as the soft follower limit occurs when $(1V)*K*R_s <<1$. The operational mode referred to as the stiff follower limit occurs when $(1V)*K*R_s >>1$. In both operational modes, the FET 204 does not conduct, and the source voltage $V_s$ is equal to zero when the gate voltage $V_g$ is less than the threshold voltage $V_{THN}$. In the soft follower configuration, the current at the source and the source voltage $V_s$ are provided in accordance with a quasi-quadratic function. In the stiff follower configuration, the current at the source and the source voltage V s are provided in accordance with a quasi-linear function.

Figure 3:
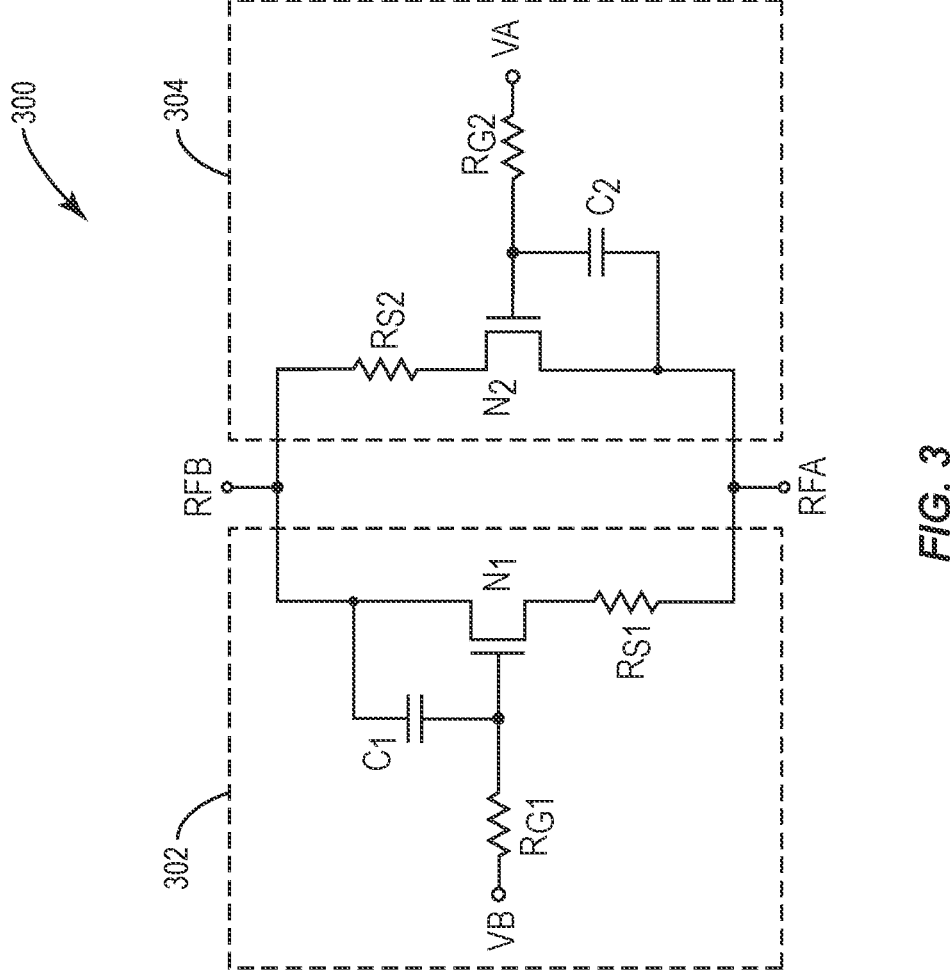
FIG. 3 illustrates a conductive cell, in accordance with some embodiments.

FIG. 3 illustrates a conductance cell 300, in accordance with some embodiments.

The conductance cell 300 and the operational characteristics of the conductance cell 300 are relevant to the construction of the conductance network 112 shown in FIG. 1, in accordance with some embodiments. The conductance cell 300 is connected between the RF terminals RFA, RFB described above with respect to FIG. 1. In this example, the conductance cell 300 has two segments 302, 304 that both operate in a manner similar to the diode-connected segment 200 shown in FIG. 2, except that the segment 302 and the segment 304 are connected so as to have opposite polarities.

The segment 302 includes an NFET $N_1$, capacitor $C_1$, resistor $R_{G1}$, bias terminal VB, and resistor $R_{S1}$. The segment 304 includes an NFET $N_2$, capacitor $C_2$, resistor $R_{G2}$, bias terminal VA, and resistor $R_{S2}$. In some embodiments, segment 302 and segment 304 are symmetrical but have opposite polarities.

With regard to segment 302, a drain of the NFET $N_1$ is connected to the RF terminal RFB. The capacitor $C_1$ is connected between the first drain/source terminal of the NFET $N_1$ and the gate of the NFET $N_1$. A first end of the resistor $R_{G1}$ is connected to the gate of the NFET $N_1$, and a second end of the resistor $R_{G1}$ is connected to the bias terminal VB. A first end of the resistor $R_{S1}$ is connected to the second drain/source terminal of the NFET $N_1$, while a second end of the resistor $R_{S1}$ is connected to the RF terminal RFA.

With regard to segment 304, a first drain/source terminal of the NFET $N_2$ is connected to the RF terminal RFA. The capacitor $C_2$ is connected between the first drain/source terminal of the NFET $N_2$ and the gate of the NFET $N_2$. A first end of the resistor $R_{G2}$ is connected to the gate of the NFET $N_2$, and a second end of the resistor $R_{G2}$ is connected to the bias terminal VA. A first end of the resistor $R_{S2}$ is connected to the second drain/source terminal of the NFET $N_2$, while a second end of the resistor $R_{S2}$ is connected to the RF terminal RFB.

A negative bias voltage is applied to the bias terminal VB and a negative bias voltage is applied to the bias terminal VA. It should be noted that in other embodiments, the bias voltage applied to the bias terminal VB and the bias terminal VA is non-negative. For example, in other embodiments, the bias voltage applied to the bias terminal VB and the bias terminal VA is zero or positive. By controlling the voltage level of these bias voltages, the voltage level of the RF signal 102 that must be reached in order for the NFETs $N_1$, $N_2$ to conduct can be controlled. In effect, the turn-on voltages of the NFETs $N_1$, $N_2$ is directly proportional with a negative constant of proportionality to the aforementioned bias voltages. Note that when the RF signal 102 has a positive polarity from the RF terminal RFA to the RF terminal RFB, the segment 304 conducts the RF signal 102 once the RF signal 102 reaches the turn-on voltage of the NFET $N_2$ while the segment 302 remains open and does not conduct. When the RF signal 102 has a negative polarity from the RF terminal RFA to the RF terminal RFB, the segment 302 conducts the RF signal 102 once the RF signal 102 reaches the turn-on voltage of the NFET $N_1$ while the segment 304 remains open and does not conduct. When the RF signal 102 has not reached the turn-on voltage of either segment, neither the segment 302 nor the segment 304 conducts.

In some embodiments, the segment 302 and the segment 304 are symmetrical. Accordingly, the capacitance of the capacitor $C_1$ and the capacitance of the capacitor $C_2$ are equal, the resistance of the resistor $R_{G1}$ and the resistance of the resistor $R_{G2}$ are equal, and the resistance of the resistor $R_{S1}$ and the resistance of the resistor $R_{S2}$ are equal. Furthermore, the NFET $N_1$ and the NFET $N_2$ have the same FET characteristics. Thus, the NFETs $N_1$, $N_2$ have the same width, the same length, and both utilize the same number of gate fingers.

The resistor $R_{G1}$ and the capacitor $C_1$ isolate (e.g., AC block) the gates of the $N_1$ transistor in the 302 segment from the bias circuitry at RF frequencies of interest. The $C_1$ and $C_2$ provide an AC short to the gate and first drain/source terminals of the $N_1$ and $N_2$ transistors at RF frequencies of interest. In some embodiments, the time constant of the resistance of the resistor $R_{G1}$ multiplied by the capacitance of the capacitor $C_1$ should be at least 10 times larger than $1/(6.28*fmin)$, where fmin is the minimum operational frequency of the switch device 110 in FIG. 1. In some embodiments, the capacitance of the capacitor $C_1$ is at least ten times larger than the maximum small signal gate-to-source capacitance of the NFET $N_1$. The resistor $R_{G2}$ and the capacitor $C_2$ isolate (e.g., AC block) the gates of the $N_2$ transistor in the 304 segment from the bias circuitry at RF frequencies of interest. In some embodiments, the time constant of the resistance of the resistor $R_{G2}$ multiplied by the capacitance of the capacitor $C_2$ should be at least 10 times larger than $1/(6.28*fmin)$. In some embodiments, the capacitance of the capacitor $C_2$ is at least ten times larger than the maximum small signal gate-to-source capacitance of the NFET $N_2$.

The resistor $R_{S1}$ and the resistor $R_{S2}$ are source degeneration resistors. The resistor $R_{S1}$ and the resistor $R_{S2}$ allow the segments 302, 304 to operate in the stiff follower limit operational mode. Thus, the NFET $N_1$ is sized and the resistance of the resistor $R_{S1}$ is selected so that (1 Volt) $*K*R_{S1}\gg1$. Additionally, the NFET $N_2$ is sized and the resistance of the resistor $R_{S2}$ is selected so that (1 Volt) $*K*R_{S2}\gg1$. In some embodiments, the segments 302, 304 are designed to operate in the soft follower limit operational mode. Thus, the NFET $N_1$ is sized and the resistance of the resistor $R_{S1}$ is selected so that (1 Volt)$*K*R_{S1}\ll1$. Additionally, the NFET $N_2$ is sized and the resistance of the resistor $R_{S2}$ is selected so that (1 Volt)$*K*R_{S2}\ll1$.

Figure 4:
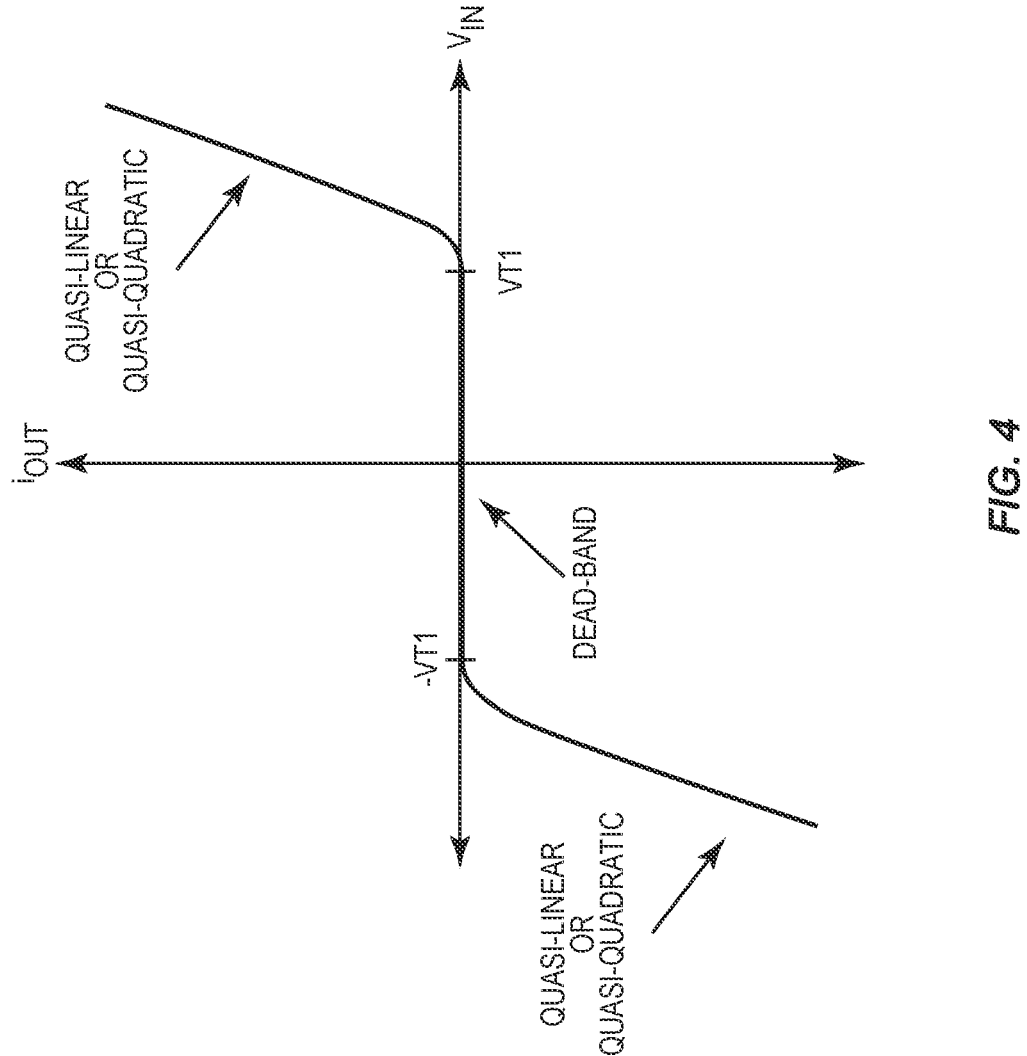
FIG. 4 is a graph that describes the voltage-to-current response of the conductive cell shown in FIG. 3, in accordance with some embodiments.

FIG. 4 is a graph that describes the voltage-to-current response of the conductance cell 300 shown in FIG. 3, in accordance with some embodiments.

In FIG. 4, the x-axis represents a voltage applied from the RF terminal RFA to the RF terminal RFB. The y-axis represents a current level of the RF signal 102 through the conductance cell 300.

When the voltage applied from the RF terminal RFA to the RF terminal RFB is positive and has a magnitude greater than a turn-on voltage VT1, the voltage-to-current response of the conductance cell 300 operates in accordance with a positive quasi-linear function (i.e., when the conductance cell 300 is operating in the stiff follower operational mode) or in accordance with a positive quasi-quadratic function (i.e., when the conductance cell 300 is operating in the soft follower operational mode). When the voltage applied from the RF terminal RFA to the RF terminal RFB is negative and has a magnitude greater than a turn-on voltage VT1, the voltage-to-current response of the conductance cell 300 operates in accordance with a negative quasi-linear function (i.e., when the conductance cell 300 is operating in the stiff follower operational mode) or in accordance with a negative quasi-quadratic function (i.e., when the conductance cell 300 is operating in the soft follower operational mode). A deadband region is provided between the voltage values VT1 and –VT1 where no current is being conducted by the conductive cell. The absolute voltage value of |VT1| is determined by the threshold voltages of the NFETs $N_1$, $N_2$ and by the bias voltage applied at the bias terminals VA, VB. By decreasing the bias voltages applied at the bias terminals VA, VB, the absolute voltage value of |VT1| is increased, thereby increasing the width of the deadband region. By increasing the bias voltages applied at the bias terminals VA, VB, the absolute voltage value of |VT1| is decreased, thereby decreasing the width of the deadband region. If the bias voltage applied at the bias terminals VA, VB is zero, then the absolute voltage value |VT1| is equal to the magnitude of the threshold voltages of the NFET $N_1$ and the NFET $N_2$.

Figure 5:
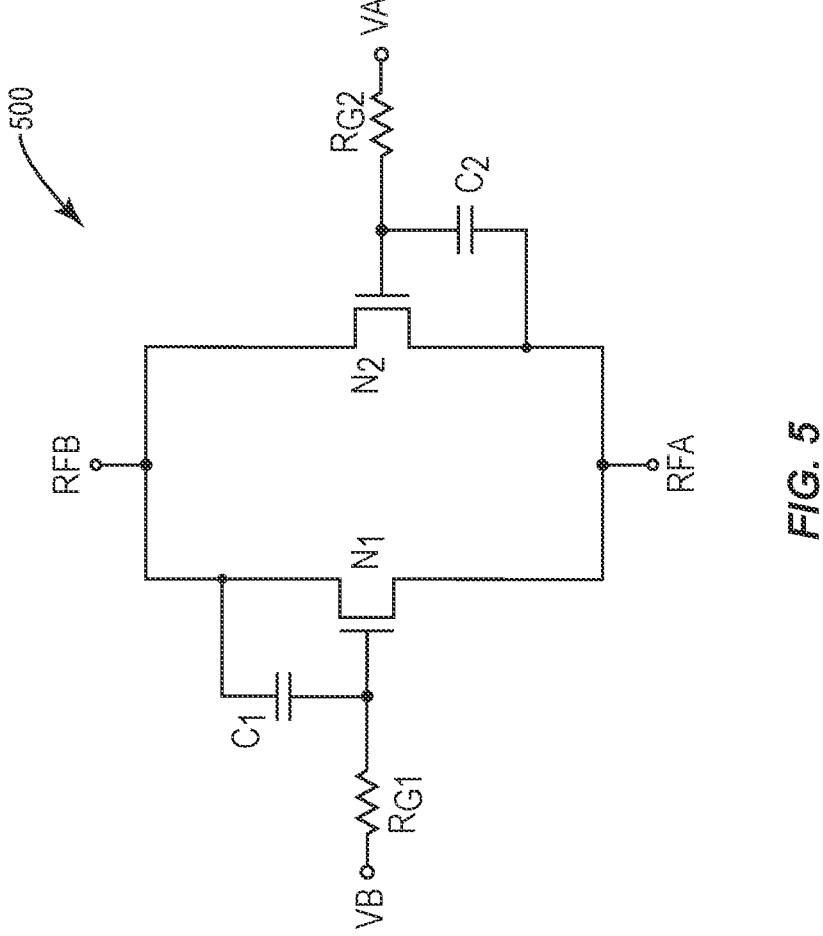
FIG. 5 illustrates a conductive cell, in accordance with some embodiments.

FIG. 5 illustrates a conductance cell 500, in accordance with some embodiments.

The conductance cell 500 is the same as the conductance cell 300, except that the conductance cell 500 does not include the resistors $R_{S1}$, $R_{S2}$. The conductance cell 500 thus operates in the soft follower operational mode. The conductance cell 500 is smaller than the conductance cell 300, in accordance with some embodiments. In some embodiments, the conductance cell 500 is more temperature sensitive since the IV characteristics of the NFETs $N_1$, $N_2$ dominates the determination of the current level of the source current.

FIG. 6 illustrates a conductance cell 600, in accordance with some embodiments.

The conductance cell 600 is the same as the conductance cell 300 shown in FIG. 2, except that the conductance cell 600 includes PFETs $P_1$, $P_2$ instead of NFETs $N_1$, $N_2$. Thus, in FIG. 2, a circuit segment 604 with the PFET $P_2$ conducts when the voltage from the RF terminal RFB to the RF terminal RFA has a positive polarity and is above the turn-on voltage of the circuit segment 604. When the voltage from the RF terminal RFB to the RF terminal RFA has the positive polarity, a circuit segment 602 with the PFET $P_1$ does not conduct. The circuit segment 602 with the PFET $P_1$ conducts when the voltage from the RF terminal RFB to the RF terminal RFA has a negative polarity and is above the turn-on voltage of the circuit segment 602. When the voltage from the RF terminal RFB to the RF terminal RFA has a negative polarity and is above the turn-on voltage of the circuit segment 602, the circuit segment 604 with the PFET $P_2$ does not conduct. If the voltage from the RF terminal RFB to the RF terminal RFA does not have a magnitude that is above the turn-on voltage of the circuit segments 602, 604, the conductance cell 600 is operating in the deadband region.

FIG. 7 is a diagram illustrating a conductance network 700, in accordance with some embodiments.

The conductance network 700 is an example of the conductance network 112 shown in FIG. 1, in accordance with some embodiments. The conductance network 700 is configured to match the IMD3 response of the switch device 110 shown in FIG. 1.

The conductance network 700 includes conductance stages referred to generically with element number 702 and individually by the element number 702 and an index between parentheses. The conductance network 700 includes an integer number N of conductance stages. The integer number N is equal to or greater than 2. Each conductance stage 702 is identified by an index integer n, where n has a range between 1 and N. The index integer n has been placed within parentheses of each conductance stage 702 to identify the conductance stage 702. Thus, the conductance network 700 includes conductance stages 702 (1) to 702(N). Each of the conductance stages 702 is connected between the RF terminal RFA and the RF terminal RFB (which are described above in FIG. 1).

In FIG. 7, each conductance stage 702 has a multiplicity that is equal to 1. In some embodiments, the segments 702 can only be comprised of the segments shown in FIG. 5 (i.e., the segments must have a deadband between two quasi-quadratic regions). The multiplicity of each of the conductance stages 702 is the number of conductance cells within the conductance stage 702. Thus, each of the conductance stages 702 in FIG. 7 have one conductance cell that is connected between the RF terminal RFB and the RF terminal RFA. In some embodiments, some or all of the conductance cells of the conductance stages 702 are arranged as shown as the conductance cell 300 shown in FIG. 3, as the conductance cell 500 shown in FIG. 5, as the conductance cell 600 shown in FIG. 6, and/or as the conductance cell 1500 shown in FIG. 15.

With regard to the conductance cells within each of the conductance stages 702, both of the bias terminals VA, VB are configured to receive a bias voltage (referred to generically with element identifier Vbias and individually by the index number n between parentheses). Each segmental conductance stage 702 is configured to have a voltage-to-current response that defines a deadband region between a pair of quasi-quadratic or quasi-linear regions. In some embodiments, the voltage-to-current response of each of the conductance stages 702 is similar to the voltage-to-current response shown in FIG. 4. However, the conductance stages 702 define a sequence of deadband regions with widths that are sequentially incremented in accordance with a voltage step. Accordingly, the width of the deadband regions is increased along the sequence of deadband regions.

In FIG. 7, the conductance stage 702(1) is the first of the conductance stages in the sequence and thus has the narrowest of deadband regions. The conductance stage 702(N) is the last of the conductance stages 702 in the sequence and thus has the widest of deadband regions. A conductance stage 702(i) (i is between 1 and N) is between the conductance stages 702(1), 702(N). Thus, conductance stage 702(i) has a deadband region that is wider than the deadband region of the conductance stage 702(1) but narrower than the deadband region of the conductance stage 702(N). In FIG. 7, the physical order (from left to right) of the conductance stages 702 is the same as the order of the sequence of deadband regions of the conductance stages 702. However, it should be noted that in some embodiments, the physical order of the conductance stages 702 is not the same as the order of the sequence of deadband regions of the conductance stages.

The bias voltages Vbias are applied to the bias terminals VB, VA of each of the conductance stages 702 in order to adjust the deadband region. In FIG. 7, the bias voltages Vbias are equal to VTHN-VOFS-n*VSTEP. Thus, the bias voltage Vbias(1) has a direct current (DC) voltage level equal to VTHN-VOFS-VSTEP, the bias voltage Vbias(i) has a DC voltage level equal to VTHN-VOFS-i*VSTEP, and the bias voltage Vbias(N) has a DC voltage level equal to VTHN-VOFS-N*VSTEP. The voltage VOFS is an offset voltage that is used to optimize the cubic fit at low amplitudes of the RF signal 102 (shown in FIG. 1). The voltage VSTEP is the incremental voltage difference used to provide the voltage step. By controlling the voltage levels of VOFS and the size of the voltage step VSTEP, the width of the deadband regions of the different conductance stages 702 is controlled so that the conductance network 700 have the same amplitude but opposite phase as the IMD3 response of the main switch 110 (shown in FIG. 1). Furthermore, the IMD3 response of the conductance network 700 is configured to match the same amplitude but opposite phase as the IMD3 response of the main switch 110 over a much wider power range.

Note that series-connected DC choke inductors that are connected to the bias terminals VB, VA represent a DC feed. Furthermore, shunt-connected DC choke inductors that are connected to the RF terminals RFA, RFB also represent a DC feed. The DC feed represented by the DC choke inductors operate as a short at frequencies well below the RF frequencies of interest, e.g. direct current (DC), and operate as an open circuit at the RF frequencies of interest.

FIG. 8 is a diagram illustrating a conductance network 800, in accordance with some embodiments.

The conductance network 800 is an example of the conductance network 112 shown in FIG. 1, in accordance with some embodiments. The conductance network 800 is configured to match the IMD3 response of the switch device 110 shown in FIG. 1.

The conductance network 800 is the same as the conductance network 700 shown in FIG. 7, except that each of the conductance stages 702 in FIG. 8 has a multiplicity different from the conductance stages 702 shown in FIG. 7. In FIG. 8, the multiplicity of each of the conductance stages 702 is equal to the index i. Thus, each of the conductance stages 702(i) has i conductance cells connected in parallel within the conductance stage 702(i). For instance, the conductance stage 702(1) has one conductance cell connected within the conductance stage 702(1). However, the conductance stage 702(N) has N number of conductance cells connected in parallel within the conductance stage 702(N). In some embodiments, some or all of the conductance cells in each of the conductance stages 702 are arranged as shown as the conductance cell 300 shown in FIG. 3, as the conductance cell 500 shown in FIG. 5, as the conductance cell 600 shown in FIG. 6, and/or as the conductance cell 1500 shown in FIG. 15. In some embodiments, the segments 702 can only be comprised of the segments shown in FIG. 3 or FIG. 6 (i.e., where these segments must have a deadband between two quasi-linear regions).

FIG. 9 illustrates a control network 900 and a conductance network 901, in accordance with some embodiments.

The conductance network 901 is an example of the conductance network 112 in FIG. 1, in accordance with some embodiments. In some embodiments, the conductance network 901 is configured as the conductance network 700 in FIG. 7. In some embodiments, the conductance network 901 is configured as the conductance network 800 in FIG. 8.

The control network 900 includes control circuitry 903. The control circuitry 903 is configured to generate the voltage VOFS and the voltage $V_{stepbegin}$. The bias terminals VB, VA of each of the conductance stages 702 (see FIG. 7 and FIG. 8) are indicated by the indicator that corresponds to the bias terminal VB, VA followed by the integer n in brackets. The integer n between the brackets indicates the conductance stage 702 that receives the corresponding bias voltage.

The control network 900 includes a passive network 909A to provide the bias voltages to the different bias terminals VA in the conductance network 901. The passive network 909A includes a bias terminal 910A, a bias terminal 911A, a resistor 912A, a resistor 914A, a resistor 916A, a resistor 918A, a resistor 920A, a resistor 922A, a resistor 924A, a resistor 926A, a capacitor 928A, and a capacitor 930A. The resistor 912A and the resistor 926A each have a resistance value of $R_B$. The resistors 914A to 924A each have a resistance value of $R_{step}$. Each of the capacitors 928A, 930A have a capacitive value of $C_B$.

The bias voltage $V_{stepbegin}$ is received at the bias terminal 911A and the bias voltage VOFS is received at the bias terminal 910A. The resistor 912A is connected in series between the bias terminal 910A and a node 932A. The resistor 914A is connected in series between the node 932A and the node 934A. The resistor 916A is connected in series between a node 934A and a node 936A. The resistor 918A is connected in series between the node 936A and a node 938A. The resistor 920A is connected in series between a node 940A and a node 941A. The resistor 922A is connected in series between the node 941A and a node 942A. The resistor 924A is connected in series between the node 942A and a node 944A. The resistor 926A is connected in series between the node 944A and the bias terminal 911A. The capacitor 928A is connected between the node 932A and a node 946A. The capacitor 930A is connected between the node 944A and a node 948A. The nodes 946A, 948A are connected to the RF terminal RFA.

Since each of the resistors 914A-924A has a resistance value of $R_{step}$, the resistance value $R_{step}$ determines an incremental voltage $V_{step}$. The bias terminal VA[1] receives the bias voltage from the node 934A. The bias terminal VA[2] receives the bias voltage from the node 936A. The bias terminal VA[3] receives the bias voltage from the node 938A. The bias terminal VA[N−2] receives the bias voltage from the node 940A. The bias terminal VA[N−1] receives the bias voltage from the node 941A. The bias terminal VA[N] receives the bias voltage from the node 942A.

The control network 900 also includes a passive network 909B to provide the bias voltages to the different bias terminals VB in the conductance network 901. The passive network 909B includes a bias terminal 910B, a bias terminal 911B, a resistor 912B, a resistor 914B, a resistor 916B, a resistor 918B, a resistor 920B, a resistor 922B, a resistor 924B, a resistor 926B, a capacitor 928B, and a capacitor 930B. The resistor 912B and the resistor 926B each have a resistance value of $R_B$. The resistors 914B-924B each have a resistance value of $R_{step}$. Each of the capacitors 928B, 930B have a capacitive value of $C_B$.

The bias voltage $V_{stepbegin}$ is received at the bias terminal 911B and the bias voltage VOFS is received at the bias terminal 910B. The resistor 912B is connected in series between the bias terminal 910B and a node 932B. The resistor 914B is connected in series between the node 932B and a node 934B. The resistor 916B is connected in series between the node 934B and a node 936B. The resistor 918B is connected in series between the node 936B and a node 938B. The resistor 920B is connected in series between a node 940B and a node 941B. The resistor 922B is connected in series between the node 941B and a node 942B. The resistor 924B is connected in series between the node 942B and a node 944B. The resistor 926B is connected in series between the node 944B and the bias terminal 911B. The capacitor 928B is connected between the node 944B and a node 946B. The capacitor 930B is connected between the node 932B and a node 948B. The nodes 946B, 948B are connected to the RF terminal RFB.

Since each of the resistors 914B-924B has a resistance value of $R_{step}$, the resistance value $R_{step}$ determines the incremental voltage $V_{step}$. The bias terminal VB[1] receives the bias voltage from the node 934B. The bias terminal VB[2] receives the bias voltage from the node 936B. The bias terminal VB[3] receives the bias voltage from the node 938B. The bias terminal VB[N−2] receives the bias voltage from the node 940B. The bias terminal VB[N−1] receives the bias voltage from the node 941B. The bias terminal VB[N] receives the bias voltage from the node 942B.

FIG. 10 is a power diagram 1000 illustrating the operation of the switching circuitry 100 in FIG. 1 using the conductance network 800 described above with respect to FIG. 8.

The power diagram has a domain of the input power (in decibel-milliwatts [dBm]) and a range of the IMD3 output power (in dBm). As shown, the input power and the output power remain linearly proportional with a proportionality constant of 3 dBm/dBm. By varying $V_{step}$ the curves can be offset in the range dimension; increasing $V_{step}$ moves the curve down. In some embodiments, very similar results are realized using the conductance network 700. In some embodiments, the conductance network 800 is the preferred over the conductance network 700 due to its reduced process sensitivity resulting from the source degeneration.

FIG. 11 is a power diagram 1100 illustrating the operation of the switching circuitry 100 in FIG. 1 using the conductance network 800 described above with respect to FIG. 8 operating into a mismatched load.

The conductance network is a piece-wise cubic conductance network (PWCCN). A PWCCN provides a cubic function through a conductance network formed from conductance stages. The power diagram has a domain of the input power (in dBm) and range of the IMD3 output power (in dBm). As shown, the conductance network 800 suppresses the IMD3 spectral output of the main switch 110 by a fixed factor that is invariant with the voltage standing wave ratio (VSWR) magnitude and the VSWR phase.

FIG. 12 a diagram 1200 of plotting the capacitive value of the variable capacitance of the capacitive device versus the IMD3 response.

As shown by FIG. 12, setting the capacitive value of the variable capacitance helps allow the conductance network 800 to inject the right amount of IMD3 to obtain good cancellation. The optimal point of the capacitive value is shown at the minima 1202 where the IMD3 is minimized.

FIG. 13 is a temperature control circuit 1300, in accordance with some embodiments.

The temperature control circuit 1300 includes a combinational logic block U1, a combinational logic block U2, a combinational logic block U3, a combinational logic block U4, a temperature-to-voltage sensor U5, an analog-to-digital converter U6, a memory U7, and a programming finite state machine U8.

The combinational logic block U1 is configured to receive a digital parameter VGON_SLOPE, a digital parameter VGON_ROOM, and a digital parameter TEMP. A digital parameter VGON represents a voltage level applied to the gate bias voltage for the main switch 110 in FIG. 1. The digital parameter VGON is converted into the gate bias voltage by a digital to analog converter (not shown.) The digital parameter VGON_ROOM indicates the voltage level of the voltage VGON at room temperature. The digital parameter VGON_SLOPE indicates the slope of the function between the temperature and the voltage level of the voltage VGON. The digital parameter TEMP indicates the average temperature of the whole network embodied in FIG. 1. The combinational logic block U1 is configured to implement a mathematical function to generate the digital parameter VGON based on the digital parameter VGON_SLOPE, the digital parameter VGON_ROOM, and the digital parameter TEMP such that the IMD3 spectral components have a prescribed first-order temperature coefficient.

The combinational logic block U2 is configured to receive a digital parameter VSTEP_SLOPE, a digital parameter VSTEP_ROOM, and a digital parameter TEMP. A digital parameter VSTEP represents the voltage level of $V_{step}$, which was described above. The digital parameter VSTEP_ROOM indicates the voltage level of the voltage VSTEP at room temperature. The digital parameter VSTEP_SLOPE indicates the slope of the function between the temperature and the voltage level of the voltage VSTEP. The combinational logic block U2 is configured to implement a mathematical function to generate the digital parameter VSTEP based on the digital parameter VSTEP_SLOPE, the digital parameter VSTEP_ROOM, and the digital parameter TEMP such that the IMD3 spectral components of the conductance network (e.g., the conductance network 112 in FIG. 1, the conductance network 700 in FIG. 7, the conductance network 800 in FIG. 8, and the conductance network 901 in FIG. 9) have the same first-order temperature coefficient as the main switch 110.

The combinational logic block U3 is configured to receive a digital parameter CC_SLOPE, a digital parameter CC_ROOM, and the digital parameter TEMP. A digital parameter CC represents a capacitance value of the variable capacitance of the capacitive device 114 in FIG. 1. The digital parameter CC_ROOM indicates the capacitance level of the capacitance CC at room temperature. The digital parameter CC_SLOPE indicates the slope of the function between the temperature and the capacitance level of the capacitance CC. The combinational logic block U3 is configured to implement a mathematical function to generate the digital parameter CC based on the digital parameter CC_SLOPE, the digital parameter CC_ROOM, and the digital parameter TEMP such that the IMD3 spectral components of the conductance network (e.g., the conductance network 112 in FIG. 1, the conductance network 700 in FIG. 7, the conductance network 800 in FIG. 8, and the conductance network 901 in FIG. 9) have the same first-order temperature coefficient as the main switch 110 versus input frequency.

The combinational logic block U4 is configured to receive a digital parameter VOFS_SLOPE, a digital parameter VOFS_ROOM, and the digital parameter TEMP. A digital parameter VOFS represents the voltage level of VOFS, which was described above. The digital parameter VOFS_ROOM indicates the voltage level of the voltage VOFS at room temperature. The digital parameter VOFS_SLOPE indicates the slope of the function between the temperature and the voltage level of the voltage VOFS. The combinational logic block U4 is configured to implement a mathematical function to generate the digital parameter VOFS based on the digital parameter VOFS_SLOPE, the digital parameter VOFS_ROOM, and the digital parameter TEMP such that the IMD3 spectral components of the conductance network (e.g., the conductance network 112 in FIG. 1, the conductance network 700 in FIG. 7, the conductance network 800 in FIG. 8, and the conductance network 901 in FIG. 9) have the same first order temperature coefficient as the main switch 110.

The temperature-to-voltage sensor U5 generates a voltage VTEMP than indicates the temperature. The digital-to-analog converter converts the voltage VTEMP into the digital parameter TEMP. In some embodiments, the temperature-to-voltage sensor U5 is a transducer that generates an output voltage that is proportional to absolute temperature given the temperature of the die at an arbitrary location. While in this embodiment, the temperature-to-voltage sensor U5 measures the average temperature of the entire network in FIG. 1 in other embodiments, the temperature being measured could be that of an arbitrary point.

The programming finite state machine U8 receives a digital input to generate a digital address. The digital address is used to write the digital parameters VGON_SLOPE, VGON_ROOM, VSTEP_SLOPE, VSTEP_ROOM, CC_SLOPE, CC_ROOM, VOFS_SLOPE, and VOFS_ROOM in the memory U7. More specifically, the memory U7 may be a non-volatile memory that can be permanently written to. In some embodiments, the finite state machine is configured to allow for factory programming of all the digital parameters on a part-by-part basis during production test given the measured IMD3 response. Since the IMD3 response of the main switch 110 will vary from part-to-part will vary from wafer lot to wafer lot, a means to measure the IMD3 response during production test and to program the optimal digital parameters via the "programming finite state machine" is the optimal trimming strategy for best IMD3 cancellation. In some embodiments, this requires that the memory U7 block in FIG. 13 be a non-volatile memory as already mentioned.

FIG. 14 is an embodiment of a temperature control circuit 1400, in accordance with some embodiments.

The temperature control circuit 1400 includes the combinational logic block U1, the combinational logic block U2, the combinational logic block U3, the combinational logic block U4, the temperature-to-voltage sensor U5, the analog-to-digital converter U6, the memory U7, and the programming finite state machine U8 described above in FIG. 13. In addition, the temperature control circuit 1400 includes a multiplexer U9, bias current generation circuit U10, current sources 1402, 1404, 1410, 1412, a voltage source 1413, resistors 1414, 1416, 1420, 1422, and NFET 1424.

The embodiment in FIG. 13 assumes that a non-volatile memory is available in the chosen process kit. In case a non-volatile memory is not available, a volatile memory can be used instead. However, a volatile memory cannot be used in production test to trim in optimal digital parameters for the control circuitry as the contents of the memory will get lost when the chip's supply voltage is removed. In this case, the extra circuitry described by the arrangement of the current sources 1402, 1404, 1410, 1412, a voltage source 1413, the resistors 1414, 1416, 1420, 1422 with the multiplexer U9 are required to in situ characterize the IMD3 response (or something related to it) of the main switch 110. In the case of the control circuitry described in FIG. 14, the channel resistance of the $N_1$ transistor and the resistance of the $R_{S1}$ source degeneration resistor is related to the IMD3 response of the main switch 110 and the conductance network 100. By measuring both and comparing against known resistance 1422, the IMD3 response of the main switch 110 and conductance network 100 can be automatically (and indirectly) discerned. With this information the programming finite state machine U8, can automatically program the digital setting needed for the U1, U2, U3 and U4 blocks. Some of the digital setting outputs of memory U7 are independent of the measurements made using the network comprised of 1412, 1424, 1413, 1410 and 1420. Even so the value of these parameters may require a means to be programmed automatically during chip power-on. This is done is by digitizing the voltage measured across a set of programming resistors R1 (1416) thru RM (1414) when a known current represented by 1402 and 1404 is applied. The purpose of the multiplexer U9 is to sequentially feed the U6 ADC input with the output voltages of the various networks at the input of the multiplexer U9 to enable it to measure all of the aforementioned voltages, which is used by the programming FSM, U8, to configure the volatile memory, U7.

FIG. 15 illustrates a conductance cell 1500, in accordance with some embodiments.

The conductance cell 1500 is a complementary cell in comparison to conductance cell 500, in FIG. 5. The conductance cell 1500 thus operates in the soft follower operational mode but instead utilizes P-channel FETs (PFETS) $P_1$, $P_2$ instead of the NFETs $N_1$, $N_2$. The conductance cell 1500 thus operates in the same manner as the conductance cell 500 except that the voltage polarities of operation are antipodal. The conductance cell 1500 is more temperature sensitive since the IV characteristics of the PFETs $P_1$, $P_2$ dominates the determination of the current level of the source current.

FIG. 16 relates to a method 1600 of cancelling (or neutralizing) IMD3 from an RF signal, in accordance with some embodiments.

In some embodiments, the method 1600 is performed using the switching circuitry 100 shown in FIG. 1. In some embodiments, the RF signal is the RF signal 102 shown in FIG. 1. The exemplary method 1600 includes blocks 1602, 1604. Flow begins at block 1602.

At block 1602, a main switch connected between a pair of RF terminals is closed. In some embodiments, the main switch is the switch device 110 shown in FIG. 1. In some embodiments, the RF terminals are the RF terminals RFA', RFB'. Flow then proceeds to block 1604.

At block 1604, at least one switch in a circuit branch with a conductance network is closed, wherein the conductance network comprises conductance stages and wherein each segmental conductance stage is configured to have a voltage-to-current response that defines a deadband region between a pair of quasi-quadratic or quasi-linear regions such that the conductance stages define a sequence of deadband regions with widths that are sequentially incremented in accordance with a voltage step.

Examples of the switch include the switch device AUX_A SW and the switch device AUX_B SW of the second circuit branch 108, shown in FIG. 1. Examples of the conductance network include the conductance network 112 in FIG. 1, the conductance network 700 shown in FIG. 7, and the conductance network 800 in FIG. 8. Examples of the conductance stages are the conductance stages 702 shown in FIG. 7 and FIG. 8. An example of the voltage-to-current response is shown as the voltage-to-current response described in FIG. 4 for the conductance cell 300 shown in FIG. 3.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. Switching circuitry, comprising:
a first RF terminal;
a second RF terminal;
a first circuit branch connected between the first RF terminal and the second RF terminal, the first circuit branch comprising a main switch, wherein the main switch generates third order intermodulation, IMD3, resonant vibrations in response to the main switch being closed; and a second circuit branch connected between the first RF terminal and the second RF terminal, the second circuit branch comprising a conductance network wherein the conductance network has an impedance with a frequency response with a same magnitude as the IMD3 resonant vibrations but with an opposite phase, wherein the conductance network comprises:
a first diode connected segment connected between an RF input terminal of the conductance network and an RF output terminal of the conductance network, wherein the first diode connected segment comprises a first diode connected field effect transistor (FET), a first capacitor, and a first resistor and wherein:
the first capacitor is connected between a gate of the first diode connected FET and the RF input terminal of the conductance network; and
the first resistor is connected between a first bias terminal and the gate of the first diode connected FET, wherein a time constant of the resistance of the first resistor multiplied by a capacitance of the first capacitor is at least 10 times larger than $1/(6.28*fmin)$, where fmin is the minimum operational frequency of the main switch;
a second diode connected segment connected between the RF input terminal of the conductance network and the RF output terminal of the conductance network, wherein the second diode connected segment comprises a second diode connected FET, a second capacitor, and a second resistor, wherein:
the second capacitor is connected between a gate of the second diode connected FET and the RF output terminal of the conductance network; and
the second resistor is connected between a second bias terminal and the gate of the second diode connected FET; and
wherein the first diode connected FET and the second diode connected FET are connected between the RF input terminal of the conductance network and the RF output terminal of the conductance network so as to have opposite polarities.

2. The switching circuitry of claim 1, wherein the second circuit branch is connected in parallel with respect to the first circuit branch.

3. The switching circuitry of claim 1, further comprising:
a first switch device connected between the first RF terminal and the RF input terminal of the conductance network; and
a second switch device connected between the RF output terminal of the conductance network and the second RF terminal.

4. The switching circuitry of claim 3, further comprising:
a third switch device connected between the RF input terminal of the conductance network and the RF output terminal of the conductance network.

5. The switching circuitry of claim 3, further comprising:
a capacitive device that is connected in parallel with the conductance network.

6. The switching circuitry of claim 5, wherein the capacitive device is configured to provide a variable capacitance.

7. The switching circuitry of claim 1, wherein the conductance network comprises:
the first diode connected segment connected between the RF input terminal of the conductance network and the RF output terminal of the conductance network;

the second diode connected segment connected between the RF input terminal of the conductance network and the RF output terminal of the conductance network; and wherein the first diode connected segment and the second diode connected segment are connected so as to have opposite polarities.

8. The switching circuitry of claim 7, wherein:

the first diode connected FET is a first diode connected N channel FET (NFET);

the second diode connected FET is a second diode connected NFET.

9. The switching circuitry of claim 1, wherein:

the first diode connected segment further comprises third resistor, wherein:

the third resistor is connected between a first drain/source terminal of the first diode connected NFET and the RF output terminal; and the second diode connected segment further comprises a fourth resistor, wherein:

the fourth resistor is connected between a second bias terminal and the gate of the second diode connected NFET.

10. The switching circuitry of claim 9, wherein:

the first bias terminal is configured to receive a first negative bias voltage; and the second bias terminal is configured to receive a second negative bias voltage.

11. The switching circuitry of claim 1, wherein:

the first diode connected FET is a first diode connected P channel FET (PFET);

the second diode connected FET is a second diode connected PFET.

12. The switching circuitry of claim 11, wherein:

the first diode connected segment further comprises third resistor, wherein:

the third resistor is connected between a first drain/source terminal of the first diode connected PFET and the RF output terminal; and the second diode connected segment further comprises a fourth resistor, wherein:

the fourth resistor is connected between a second bias terminal and the gate of the second diode connected PFET.

13. The switching circuitry of claim 12, wherein:

the first bias terminal is configured to receive a first positive bias voltage; and the second bias terminal is configured to receive a second positive bias voltage.

14. The switching circuitry of claim 1, wherein the conductance network is configured to have a voltage to current response that defines a deadband region between a pair of quasi-quadratic or quasi-linear regions.

15. The switching circuitry of claim 1, wherein the conductance network comprises a plurality of conductance stages coupled between the RF input terminal of the conductance network and the RF output terminal of the conductance network.

16. The switching circuitry of claim 15, wherein each of the plurality of conductance stages is configured to have a voltage to current response that defines a deadband region between a pair of quasi-quadratic or quasi-linear regions.

* * * * *